United States Patent
Muniandy et al.

(10) Patent No.: US 8,945,989 B2
(45) Date of Patent: Feb. 3, 2015

(54) STIFFENED SEMICONDUCTOR DIE PACKAGE

(71) Applicants: Kesvakumar V. C. Muniandy, Klang (MY); Navas Khan Oratti Kalandar, Petaling Jaya (MY)

(72) Inventors: Kesvakumar V. C. Muniandy, Klang (MY); Navas Khan Oratti Kalandar, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/292,938

(22) Filed: Jun. 1, 2014

(65) Prior Publication Data
US 2014/0302641 A1 Oct. 9, 2014

Related U.S. Application Data

(62) Division of application No. 13/857,131, filed on Apr. 4, 2013, now Pat. No. 8,772,913.

(51) Int. Cl.
| | |
|---|---|
| H01L 21/78 | (2006.01) |
| H01L 23/00 | (2006.01) |
| H01L 23/367 | (2006.01) |
| H01L 23/498 | (2006.01) |
| H01L 21/56 | (2006.01) |
| H01L 23/16 | (2006.01) |
| H01L 23/538 | (2006.01) |
| H01L 23/58 | (2006.01) |
| H01L 23/42 | (2006.01) |
| H01L 23/31 | (2006.01) |

(52) U.S. Cl.
CPC ............ *H01L 23/562* (2013.01); *H01L 23/367* (2013.01); *H01L 23/49805* (2013.01); *H01L 21/568* (2013.01); *H01L 23/16* (2013.01); *H01L 23/5389* (2013.01); *H01L 23/585* (2013.01); *H01L 21/565* (2013.01); *H01L 21/78* (2013.01); *H01L 24/19* (2013.01); *H01L 23/42* (2013.01); *H01L 23/3128* (2013.01); *H01L 23/49816* (2013.01); *H01L 2224/16225* (2013.01); *H01L 2924/15311* (2013.01)
USPC ........................... 438/113; 438/108; 438/109

(58) Field of Classification Search
USPC .......................................... 438/113, 108, 109
See application file for complete search history.

(56) References Cited

U.S. PATENT DOCUMENTS

| | | | |
|---|---|---|---|
| 7,993,972 | B2 | 8/2011 | Lin et al. |
| 8,093,704 | B2 | 1/2012 | Palmer |
| 2002/0173077 | A1 | 11/2002 | Ho et al. |
| 2009/0057887 | A1 | 3/2009 | Mclellan et al. |
| 2009/0127686 | A1 | 5/2009 | Yang |
| 2011/0068481 | A1 | 3/2011 | Park |
| 2012/0001339 | A1 | 1/2012 | Malatkar |

*Primary Examiner* — Long Pham
(74) *Attorney, Agent, or Firm* — Charles Bergere

(57) ABSTRACT

A stiffened semiconductor die package has a semiconductor die including an integrated circuit. The die has an active side with die bonding pads and an opposite inactive side. A conductive frame that acts as a ground plane surrounds all edges of the die and a mold compound covers the conductive frame and the edges of the die. A thermally conductive sheet is attached to the inactive side of the die. A dielectric support structure with external connector pads with solder deposits is attached to the active side of the die. The external connector pads are selectively electrically coupled to the die bonding pads.

11 Claims, 6 Drawing Sheets

STIFFENED SEMICONDUCTOR DIE PACKAGE

This application is a divisional of U.S. application Ser. No. 13/857,131 entitled "STIFFENED SEMICONDUCTOR DIE PACKAGE" filed on Apr. 4, 2013 and assigned to the same assignee hereof.

BACKGROUND OF THE INVENTION

The present invention relates to semiconductor packaging and, more particularly, to a stiffened semiconductor die package.

Semiconductor die packages are often manufactured with increased functionality. As a result, the number of external connectors (pin count) must often be increased to accommodate the increased functionality and power supply rail requirements of the semiconductor die. The number of external connectors is due to the increase in the number of die connection pads comprising power rail pads, ground rail pads and data input and output pads. Other requirements of increased functionality semiconductor die packages can include increased heat dissipation and reduced package thickness, especially when the package is to be incorporated into a small handheld device where reduced device size can be a major specification requirement. Unfortunately, relatively thin semiconductor packages can warp during manufacturing, which may affect package yield. When populating circuit boards, such warping may also affect pick-and-place machine performance since the warped packages may not have a suitable flat surface required by suction cups of the pick-and-place machine.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
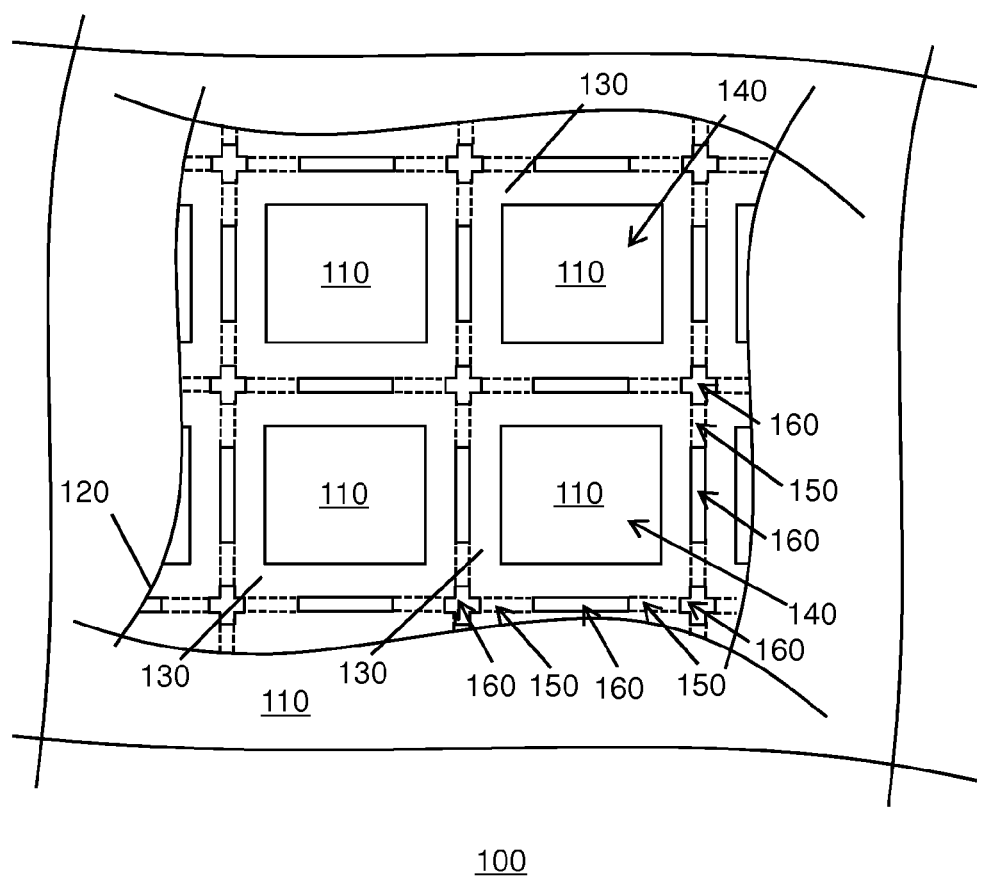
FIG. 1 is a top plan view of part of an assembly structure in accordance with a preferred embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a stiffened semiconductor die package including a semiconductor die including an integrated circuit, the semiconductor die having an active side with die bonding pads and an opposite inactive side. A conductive frame that acts as a ground plane surrounds the edges of the die and a mold compound encapsulates the conductive frame and surrounds the edges of the die. The stiffened semiconductor die package has a thermally conductive sheet attached to the inactive side of the semiconductor die and there is a dielectric support structure with external connector pads having solder deposits mounted thereto. The dielectric support structure is attached to the active side of the semiconductor die and the external connector pads are selectively electrically coupled to the die bonding pads.

In another embodiment, the present invention provides a method of manufacturing stiffened semiconductor die packages. The method includes providing an assembly structure having a temporary support with a sheet of interconnected ground plane conductive frames mounted thereto, where each of the frames defines a die enclosure. Semiconductor dies are placed into respective die enclosures. The die has an integrated circuit formed therein, an active side with die bonding pads placed adjacent the temporary support, and an inactive side opposite the active side. A molding process is performed to encapsulate or cover the ground plane conductive frames, and the semiconductor dies, which covers the inactive side of each die. Next, a process of removing part of the mold compound to expose the inactive side of the semiconductor die is performed. The method also includes attaching a thermally conductive sheet to the inactive side of the semiconductor die, and replacing the temporary support with a dielectric support structure that has external connector pads selectively electrically coupled to the die bonding pads. There is also performed a process of separating the ground plane conductive frames from each other to thereby provide the stiffened semiconductor die packages.

Referring to FIG. 1, a top plan view of part of an assembly structure 100 in accordance with a preferred embodiment of the present invention is shown. The assembly structure 100 includes a temporary support 110 with a sheet 120 mounted on the temporary support 110. The sheet 120 is a sheet of interconnected ground plane conductive frames 130 and each of the frames 130 defines a die enclosure 140, each enclosure 140 being an aperture in the sheet 120 that exposes the temporary support 110. There are blank slots 150 and through slots 160 in the interconnected ground plane conductive frames 130, the blank slots 150 are on an underside of the sheet 120 and the through slots 160 expose areas of the temporary support 110.

Figure 2:
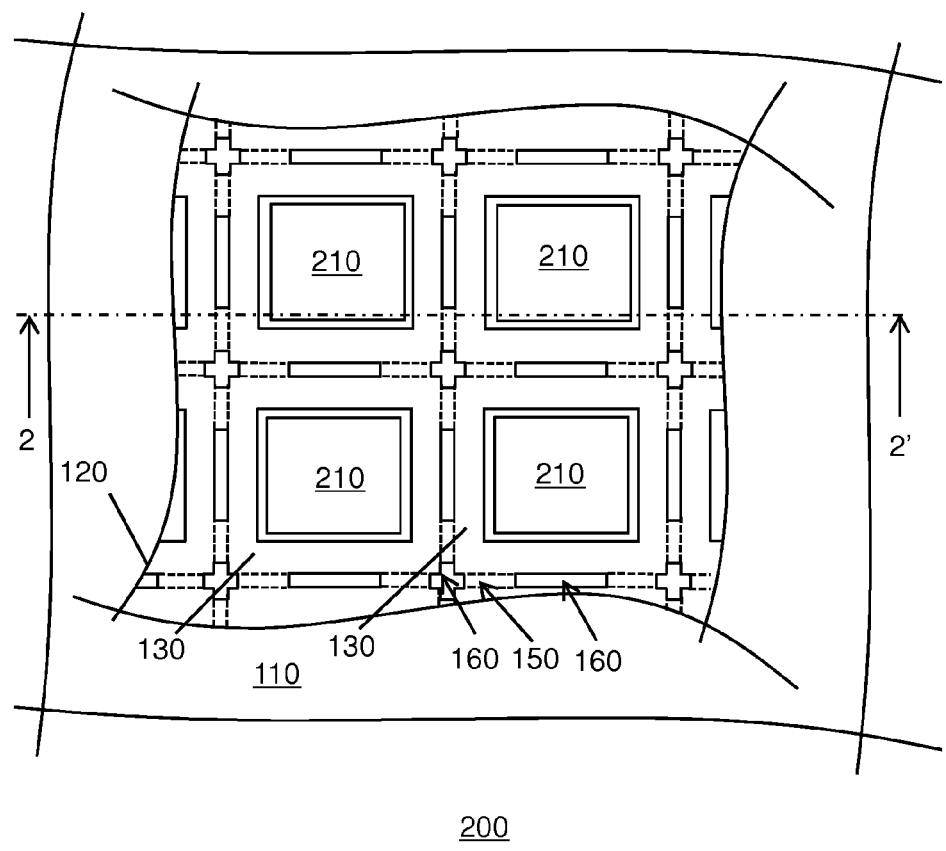
FIG. 2 is a top plan view of part of a temporary die assembly in accordance with a preferred embodiment of the present invention.

Referring to FIG. 2, a top plan view of part of a temporary die assembly 200 in accordance with a preferred embodiment of the present invention is shown. The temporary die assembly 200 is the assembly structure 100 with a semiconductor die 210 placed into a respective die enclosure 140 so that each semiconductor die 210 is mounted on the temporary support 110.

Figure 3:
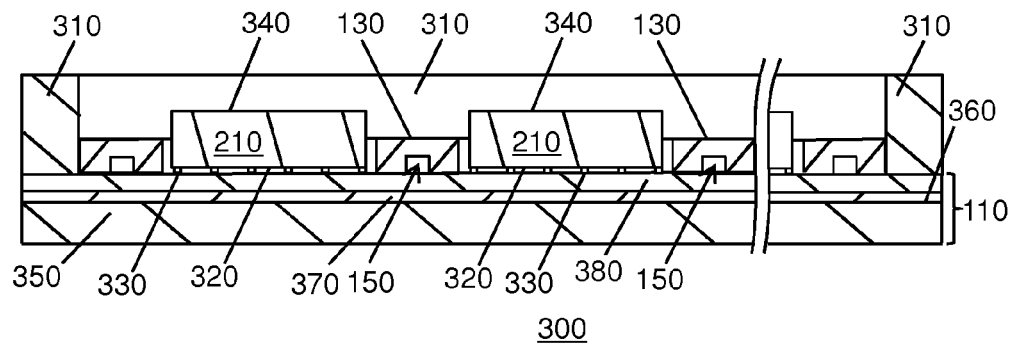
FIG. 3 is a cross-sectional side view, through 2-2' of the temporary die assembly of FIG. 2, with an abutting mold frame in accordance with a preferred embodiment of the present invention.

Referring to FIG. 3, a cross-sectional side view, through 2-2', of a temporary framed die assembly 300 in accordance with a preferred embodiment of the present invention is shown. The temporary framed die assembly 300 is the temporary die assembly 200 with an abutting mold frame 310 that abuts the temporary support 110. It will be clear from this illustration that each semiconductor die 210 has an active side, 320 with die bonding pads 330 placed adjacent the temporary support 110, and an inactive side 340 that is opposite to the active side 320. Also, as will be apparent to a person skilled in the art, the die bonding pads 330 are circuit access nodes for accessing, controlling, powering or communicating with an electronic circuit provided by each semiconductor die 210.

The temporary support 110 is a multi-layered structure comprising a glass or ceramic substrate 350 with an upper surface 360 coated with a thermal release tape 370. On top of the thermal release tape 370 is a double-sided silicon polyimide adhesive tape 380 which fixes to the temporary support 110: each semiconductor die 210; the sheet 120 of ground plane conductive frames 130; and the mold frame 310.

Figure 4:
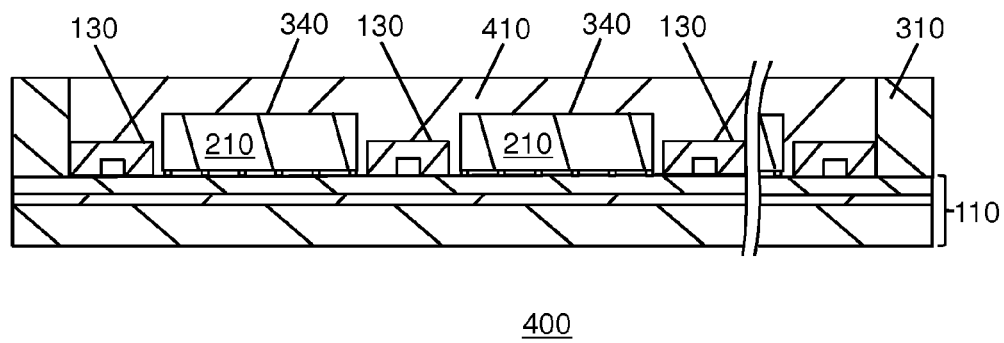
FIG. 4 is a cross-sectional side view of a molded temporary assembly in accordance with a preferred embodiment of the present invention.

Referring to FIG. 4, a cross-sectional side view of a molded temporary assembly 400, in accordance with a preferred embodiment of the present invention, is shown. The molded temporary assembly 400 is the temporary framed die assembly 300 after a process of molding. The molding process is usually performed by a liquid encapsulation or compression molding process and typically molds a single slab-like mold compound 410 over the ground plane conductive frames 130, and each semiconductor die 210. As a result, the mold compound 410 encapsulates or covers the inactive side 340 of each die 210.

Figure 5:
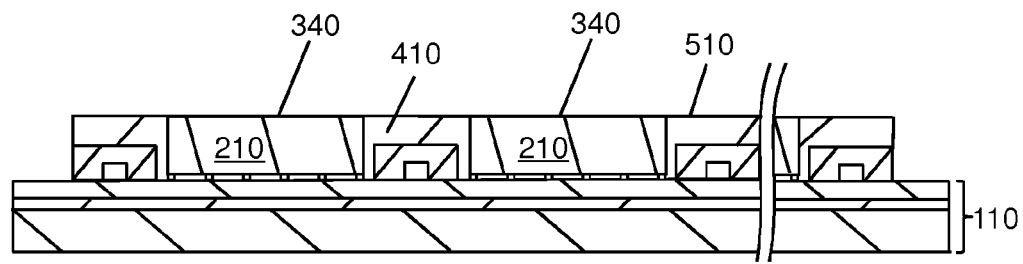
FIG. 5 is a cross-sectional side view of a ground temporary assembly in accordance with a preferred embodiment of the present invention.

FIG. 5 is a cross-sectional side view of a ground temporary assembly 500 in accordance with a preferred embodiment of the present invention. The ground temporary assembly 500 is the molded temporary assembly 400 after the mold frame 310 has been removed and part of the mold compound 410 has been removed by a grinding process. The grinding process removes enough of the mold compound 410 to expose the inactive side 340 of the semiconductor die 210. Typically the grinding process also removes a layer of the inactive side 340 of the semiconductor die 340 and results in both cleaning the inactive side 340 and providing an upper planar surface 510. The upper planar surface is formed by both a ground surface of the mold compound 410 and inactive side 340 of the semiconductor die 210.

Figure 6:
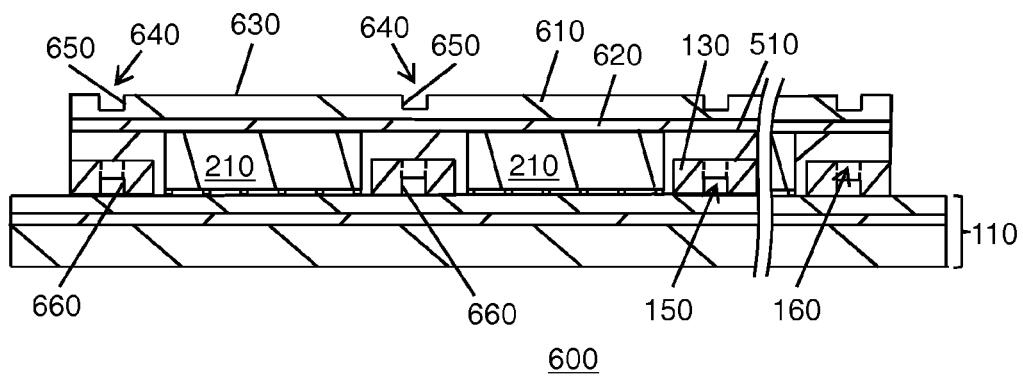
FIG. 6 is a cross-sectional side view of a stiffened temporary assembly in accordance with a preferred embodiment of the present invention.

Referring to FIG. 6, a cross-sectional side view of a stiffened temporary assembly 600 in accordance with a preferred embodiment of the present invention is shown. The stiffened temporary assembly 600 is the ground temporary assembly 500 with a thermally conductive sheet 610 attached to the upper planar surface 510 by a thermally conductive epoxy 620. The thermally conductive sheet 610 has an upper surface 630 with slots 640 and side surfaces 650 of the slots define outer edges of respective stiffened semiconductor die packages (shown later) formed by the assembly 600. The slots 640 are aligned with the slots 150, 160 in the ground plane conductive frames 130, and slots 150, 160 also have side surfaces 660 that define outer edges of respective stiffened semiconductor die packages (shown later) formed by the assembly 600. The width of the slots 150, 160 and 640 are identical and since these slots are aligned, their respective side surfaces 650, 660 are coplanar.

Figure 7:
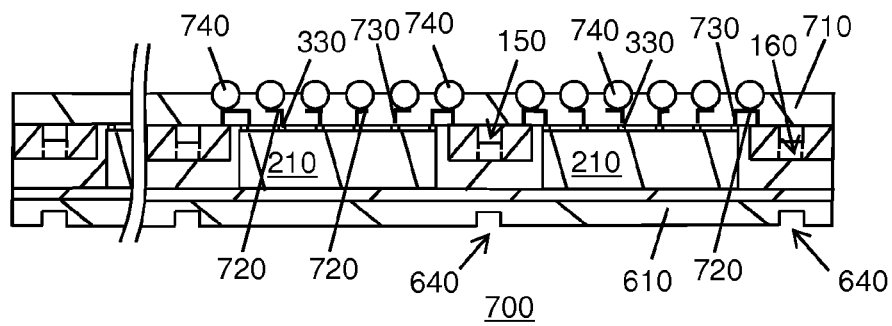
FIG. 7 is a cross-sectional inverted side view of an integrated assembly of stiffened semiconductor die packages in accordance with a preferred embodiment of the present invention.

FIG. 7 is a cross-sectional inverted side view of an integrated assembly of stiffened semiconductor die packages 700 in accordance with a preferred embodiment of the present invention. The integrated assembly of stiffened semiconductor die packages 700 is the stiffened temporary assembly 600 with the temporary support 110 replaced with a dielectric support structure 710. The dielectric support structure 710 has external connector pads 720 that are selectively electrically coupled to the die bonding pads 330 by electrically conductive runners 730 or any other connector arrangement that are known in the art. Typically, the dielectric support structure 710 is selectively formed from multiple masked layers (deposits) of dielectric material and conductive material. The conductive material is typically copper and provides the runners 730 and connector pads 720 by spin coating, sputtering or electroplating. Mounted to the external connector pads 720 are solder deposits in the form of solder balls 740 that have been held temporarily in place (by a flux paste) and then soldered, by a solder reflow heating process, to their respective external connector pads 720.

Figure 8:
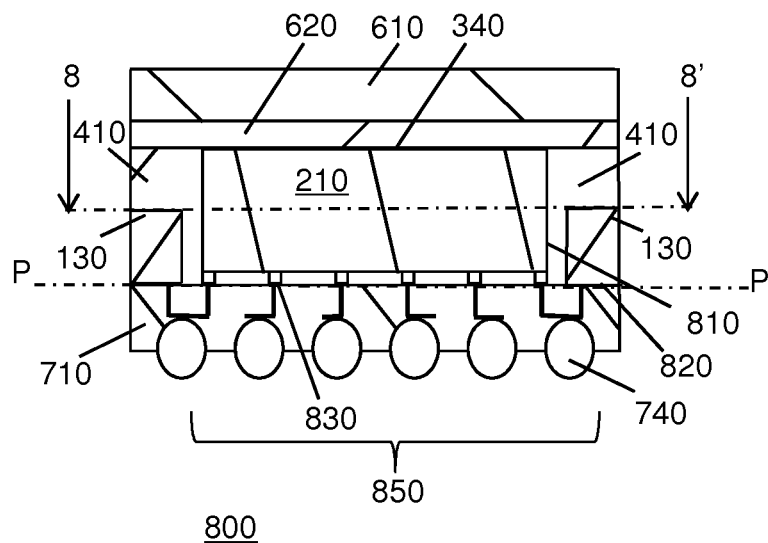
FIG. 8 is a cross-sectional side view of a stiffened semiconductor die package in accordance with a preferred embodiment of the present invention.

FIG. 8 is a cross-sectional side view of a stiffened semiconductor die package 800 in accordance with a preferred embodiment of the present invention. The stiffened semiconductor die package 800 is a package formed by separating the integrated assembly of stiffened semiconductor die packages 700 into individual die packages by a cutting, punching or sawing process typically known as singulating. Each separated (singulated) stiffened semiconductor die package 800 includes a single ground plane conductive frame 130 to which is molded the mold compound 410. The mold compound 410 is also molded to all edges 810 of the semiconductor die 210 and therefore provides both structural support and a moisture barrier. Also each part of the separated (singulated) along the slots 150, 160 and 640 typically by a saw with a blade width identical to the width of the slots 150, 160 and 640. The slots 150, 160 and 640 therefore approximately define outer edges of the stiffened semiconductor die package 800 and reduce the demands on the blade thus facilitating a relatively fast and efficient singulation process.

The stiffened semiconductor die package 800 has the singulated area of the thermally conductive sheet 610 attached to the inactive 340 side of the semiconductor die 210. The inactive side 340 is coplanar with the aligned surface of the mold compound 410 and forms the planar surface 510 to which is attached the singulated area of the thermally conductive sheet 610. As shown, the dielectric support structure 710 is attached to the ground plane conductive frame 130 and thus the ground plane conductive frame 130 and mold compound 410 are sandwiched between the thermally conductive sheet 610 and dielectric support structure 710. Furthermore, a surface 820 of the ground plane conductive frame 130 is coplanar, along a plane P, with a surface of the die bonding pads 830. Also, the external connector pads 720 that are selectively electrically coupled to the die bonding pads 330, or the singulated ground plane conductive frame 130, by the electrically conductive runners 730. In addition in this embodiment the solder deposits 740 form a ball grid array (BGA) structure 850 for surface mounting the stiffened semiconductor die package 800 to a circuit board.

Figure 9:
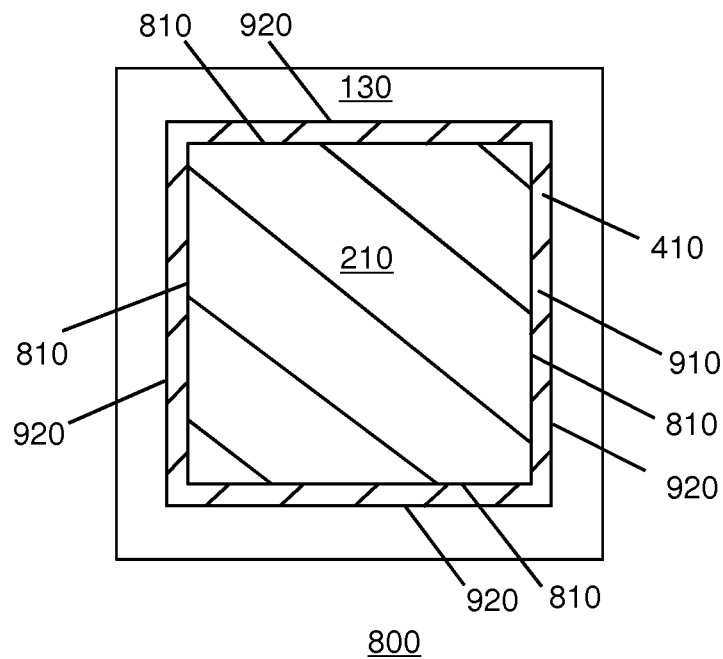
FIG. 9 is a cross-sectional plan view through 8-8' of the stiffened semiconductor die package of FIG. 8 in accordance with a preferred embodiment of the present invention.

Referring to FIG. 9, a cross-sectional plan view through 8-8' of the stiffened semiconductor die package 800 in accordance with a preferred embodiment of the present invention is illustrated. The ground plane conductive frame 130 surrounds all edges 810 of the semiconductor die 210 and also surrounds some of the mold compound 410 that is molded to the ground plane conductive frame 130. More specifically, part of the mold compound 410 forms a rectangular frame 910 around the edges 810 of the semiconductor die 210. The rectangular frame 910 is sandwiched between inner edges 920 of the ground plane conductive frame 130 and the edges 810 of the semiconductor die 210.

Figure 10:
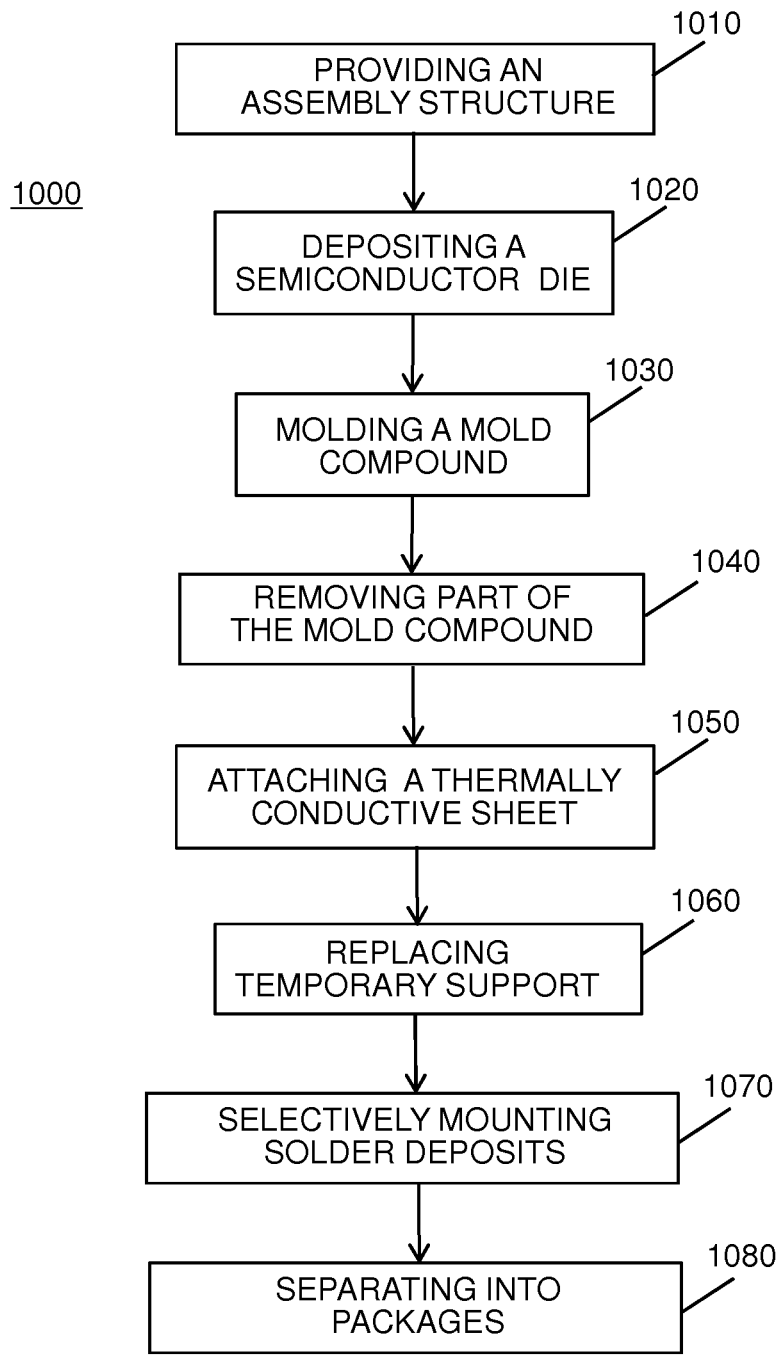
FIG. 10 is a flow chart illustrating a method of manufacturing stiffened semiconductor die packages in accordance with a preferred embodiment of the present invention.

Referring to FIG. 10, a flow chart illustrating a method 1000 of manufacturing stiffened semiconductor die packages 800 in accordance with a preferred embodiment of the present invention is shown. The method 1000, at a providing block 1010, provides the assembly structure 100 having the temporary support 110 with the sheet of interconnected ground plane conductive frames 130. At a placing block 1020, a process of placing the dies 210 into respective die enclosures 140 to form the temporary die assembly 200 is performed. The method 1000, at a molding block 1030, then performs a process molding the mold compound 410 to the ground plane conductive frames 130 and every semiconductor die 210. The process of molding is usually performed by a liquid encapsulation or compression molding process. After the molding process is completed, the mold compound 410 covers the inactive side 340 of each die 210 so that there is a single slab-like mold compound 410 over the ground plane conductive frames 130 and each semiconductor die 210.

At a removing block 1040, a grinding process is performed to remove part of the mold compound 410 to expose the inactive side 340. The grinding process typically removes a layer of the inactive side 340. The grinding process also results in the inactive side 340 being coplanar with the aligned surface of the mold compound 410 and thus forms the planar surface 510. The method 1000, at an attaching block 1050, performs a procedure of attaching the thermally conductive sheet 610 to the inactive side 340 of the semiconductor die 210 and also to the aligned planar surface 510 of the mold compound 410.

At a replacing block 1060, the temporary support 110 is replaced with the dielectric support structure 710 that has the external connector pads 720 selectively electrically coupled to the die bonding pads 330. The dielectric support structure 710 and external connector pads 720 are formed by Redistributed Chip Packaging (RCP) techniques, which include photolithography and copper plating to create the required interconnects. It will therefore be apparent to a person skilled in the art that the dielectric support structure 710 is selectively formed from multiple masked layers (deposits) of dielectric material and conductive material.

At a selectively mounting block 1070 there is performed a process of selectively mounting the solder deposits (solder balls 740) to the external connector pads 720. Also, at a separating block 1080, the ground plane conductive frames 130 are separated from each other by a singulation process to thereby provide the stiffened semiconductor die packages 800. As mentioned above, the singulation process is performed by cutting or sawing along the slots 150, 160 and 640, and the singulation process also includes separating the single mold 410 as will be apparent to a person skilled in the art. Furthermore, the resulting individual semiconductor die packages 800 include the ball grid array structure 850 formed by the solder deposits (solder balls 740).

Advantageously, the present invention provides a relatively thin stiffened semiconductor die package 800 that at least alleviates problems of warping during manufacturing since the thermally conductive sheet 610 and mold compound 410 provide additional rigidity or stiffening. Also, the thermally conductive sheet 610 is attached to the inactive side 340 of the semiconductor die 210 which can therefore assist in heat dissipation. In addition, the aligned slots 150, 160 and 640 approximately define outer edges of the stiffened semiconductor die package 800 and thus alleviate or reduce the demands on the cutting blades during singulation.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of manufacturing stiffened semiconductor die packages, the method comprising:
    providing an assembly structure having a temporary support with a sheet of interconnected ground plane conductive frames mounted thereto, wherein each of the conductive frames defines a die enclosure;
    placing semiconductor dies into respective ones of the die enclosures, wherein the semiconductor dies include integrated circuits, and wherein each semiconductor die has an active side with die bonding pads placed adjacent the temporary support and an inactive side opposite the active side;
    encapsulating the conductive frames and semiconductor dies with a mold compound;
    removing part of the mold compound from the semiconductor dies to expose the inactive sides of the semiconductor dies;
    attaching a thermally conductive sheet to the inactive sides of the semiconductor dies;
    replacing the temporary support with a dielectric support structure that has external connector pads selectively electrically coupled to the die bonding pads; and
    separating the conductive frames from each other to thereby provide the stiffened semiconductor die packages.

2. The method of manufacturing stiffened semiconductor die packages of claim 1, wherein the removing is performed by grinding.

3. The method of manufacturing stiffened semiconductor die packages of claim 2, wherein the grinding removes a layer of the inactive side of the semiconductor die.

4. The method of manufacturing stiffened semiconductor die packages of claim 1, wherein the mold compound is a single mold covering the sheet of interconnected conductive frames.

5. The method of manufacturing stiffened semiconductor die packages of claim 4, wherein the separating includes separating both the single mold and the conductive sheet.

6. The method of manufacturing stiffened semiconductor die packages of claim 1, wherein at least one of the external connector pads is also electrically coupled to the conductive frame.

7. The method of manufacturing stiffened semiconductor die packages of claim 1, further comprising selectively mounting solder deposits to the external connector pads to form a grid array structure, wherein the selectively mounting is performed before the separating process.

8. The method of manufacturing stiffened semiconductor die packages of claim 1, wherein the thermally conductive sheet has slots therein and surfaces of the slots define outer edges of a respective one of the stiffened semiconductor die packages.

9. The method of manufacturing stiffened semiconductor die packages of claim 8, wherein the sheet of interconnected ground plane conductive frames has slots therein and surfaces of the slots define outer edges of the semiconductor die packages.

10. The method of manufacturing stiffened semiconductor die packages of claim 9, wherein the separating the ground plane conductive frames from each other is characterized by the separating being performed along the slots in the thermally conductive sheet and the slots in the ground plane conductive frames.

11. The method of manufacturing stiffened semiconductor die packages of claim 1, wherein the removing causes the inactive surface of the semiconductor die to be coplanar with an aligned surface of the mold compound and the attaching also attaches the thermally conductive sheet to the aligned surface of the mold compound.

\* \* \* \* \*